(12) United States Patent
Hsu et al.

(10) Patent No.: US 10,854,791 B2
(45) Date of Patent: Dec. 1, 2020

(54) WAVELENGTH CONVERSION MODULE, METHOD FOR FORMING WAVELENGTH CONVERSION MODULE, AND PROJECTION DEVICE

(71) Applicant: Coretronic Corporation, Hsin-Chu (TW)

(72) Inventors: Pi-Tsung Hsu, Hsin-Chu (TW); Chi-Tang Hsieh, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/403,603

(22) Filed: May 5, 2019

(65) Prior Publication Data
US 2020/0013930 A1 Jan. 9, 2020

(30) Foreign Application Priority Data

Jul. 6, 2018 (CN) .......................... 2018 1 0734159

(51) Int. Cl.
*H01L 33/50* (2010.01)
*H01L 33/64* (2010.01)
(Continued)

(52) U.S. Cl.
CPC ........ *H01L 33/502* (2013.01); *G03B 21/2033* (2013.01); *H01L 33/005* (2013.01); *H01L 33/46* (2013.01); *H01L 33/501* (2013.01); *H01L 33/641* (2013.01); *H04N 9/3158* (2013.01); *H04N 9/3197* (2013.01); *H01L 2933/0041* (2013.01)

(58) Field of Classification Search
CPC ..... H01L 33/50; H01L 33/501; H01L 33/502; H01L 33/504; H01L 33/641; H01L 2933/0041
USPC .......................................................... 257/98
See application file for complete search history.

(56) References Cited

U.S. PATENT DOCUMENTS 9,546,765 B2 * 1/2017 Dai ............................ F21V 7/26
2008/0122343 A1 * 5/2008 Maruyama ................ H01J 1/63
313/503
(Continued)

FOREIGN PATENT DOCUMENTS

CN 101180557 5/2008
CN 104736930 6/2015
(Continued)

*Primary Examiner* — Matthew E Warren
(74) *Attorney, Agent, or Firm* — JCIPRNET

(57) ABSTRACT

A wavelength conversion module, a method for forming a wavelength conversion module, and a projection device are provided. The wavelength conversion module includes a substrate and a wavelength conversion layer. The wavelength conversion layer is located on the substrate and has a plurality of first holes. The wavelength conversion layer includes a wavelength conversion material, a first bonding material, and a first filling adhesive material. The wavelength conversion material is dispersed in the first bonding material. The first filling adhesive material is configured to fill at least a portion of the first holes. The projection device includes the wavelength conversion module, an excitation light source, a light valve, and a projection lens. The wavelength conversion module provided herein has good conversion efficiency and reliability.

14 Claims, 11 Drawing Sheets

(51) Int. Cl.
*H01L 33/46* (2010.01)
*H04N 9/31* (2006.01)
*G03B 21/20* (2006.01)
*H01L 33/00* (2010.01)

(56) References Cited

U.S. PATENT DOCUMENTS

| | | | | |
|---|---|---|---|---|
| 2016/0043285 | A1* | 2/2016 | Basin | H01L 33/644 |
| | | | | 257/98 |
| 2016/0254417 | A1* | 9/2016 | Morimura | H01L 33/508 |
| | | | | 257/98 |
| 2018/0158995 | A1* | 6/2018 | Li | H01L 33/501 |

FOREIGN PATENT DOCUMENTS

| | | |
|---|---|---|
| CN | 106206904 | 12/2016 |
| CN | 107255865 | 10/2017 |
| TW | I572066 | 2/2017 |

* cited by examiner

200A

200B

WAVELENGTH CONVERSION MODULE, METHOD FOR FORMING WAVELENGTH CONVERSION MODULE, AND PROJECTION DEVICE

CROSS-REFERENCE TO RELATED APPLICATION

This application claims the priority benefit of China application serial no. 201810734159.4, filed on Jul. 6, 2018. The entirety of the above-mentioned patent application is hereby incorporated by reference herein and made a part of this specification.

BACKGROUND

Technical Field

The disclosure relates to an optical module, a method for forming the same, and an optical device including the optical component; particularly, the disclosure relates to a wavelength conversion module, a method for forming a wavelength conversion module, and a projection device.

Description of Related Art

Recently, projection devices using solid-state light sources such as light-emitting diodes (LEDs) and laser diodes have gradually gained a place in the market. The laser diode can achieve higher light emitting efficiency by about 20%; hence, in order to break the limitation to the LED acting as a light source, phosphor powder has been excited by an excitation light source to generate a solid color light source required by a projector.

However, generally speaking, the manufacturing process of the existing phosphor wheel is to coat a substrate of the phosphor wheel with phosphor powder or a mixture of a reflective material and silicone to form a wavelength conversion layer or a reflective layer of the phosphor wheel, respectively. However, silicone is not resistant to high temperature and may degrade. Hence, when a laser beam irradiates the phosphor wheel for a long time, such low resistance to high temperature may lead to degradation or burnout of silicone, which poses a negative impact on the light emitting efficiency and reliability of the phosphor wheel. On the other hand, another manufacturing process of the phosphor wheel is to replace silicone with an inorganic adhesive material (e.g., glass adhesive or a ceramic material) and apply the mixture of the inorganic adhesive material and phosphor or the reflective material to form the phosphor wheel. The phosphor wheel formed by applying this manufacturing process has better thermal conductivity and heat resistance; however, during a process of sintering or curing such a phosphor wheel, some binders, dispersants, additives, and so forth may volatilize into the air, thus creating holes inside the wavelength conversion layer or the reflective layer. The existence of these holes may deteriorate the conversion efficiency of the wavelength conversion layer and lessen the thermal conductive effect of the wavelength conversion layer or the reflective layer, whereby the reliability and the life time of the phosphor wheel are both reduced.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides a wavelength conversion module with good conversion efficiency and reliability.

The disclosure provides a method for forming a wavelength conversion module capable of forming a wavelength conversion module with good conversion efficiency and reliability.

The disclosure provides a projection device with good optical quality and reliability.

Other objects and advantages may be further understood from the technical features provided in the disclosure.

To achieve one or some or all of the objects above or other objects, an embodiment of the invention provides a wavelength conversion module. The wavelength conversion module includes a substrate and a wavelength conversion layer. The wavelength conversion layer is located on the substrate and has a plurality of first holes. The wavelength conversion layer includes a wavelength conversion material, a first bonding material, and a first filling adhesive material. The wavelength conversion material is dispersed in the first bonding material. The first filling adhesive material is configured to fill at least one portion of the first holes.

To achieve one or some or all of the objects above or other objects, an embodiment of the invention provides a projection device. The projection device includes the wavelength conversion module, an excitation light source, a light valve, and a projection lens. The excitation light source for emitting an excitation beam, wherein the excitation beam is transmitted to the wavelength conversion module and converted into a converted beam by the wavelength conversion module, and the excitation beam and the converted beam form an illumination beam. The light valve is located on a transmission path of the illumination beam and is configured to convert the illumination beam into an image beam. The projection lens is located on the transmission path of the image beam and is adapted to convert the image beam into a projection beam.

To achieve one or some or all of the objects above or other objects, an embodiment of the invention provides a method for forming a wavelength conversion module, including following steps. A substrate is provided. A wavelength conversion layer is formed on the substrate through performing a wavelength conversion layer manufacturing process. The process includes: providing a wavelength conversion material and a first bonding material, wherein the wavelength conversion material is dispersed in the first bonding material; curing the wavelength conversion material and the first bonding material at a first curing temperature, forming a plurality of first holes dispersed in the first bonding material, providing a first filling adhesive material and filling the first filling adhesive material in at least one portion of the first holes, and curing the first filling adhesive material at a second curing temperature to form the wavelength conversion layer.

Based on the above, the embodiments of the invention have at least one of the following advantages or efficacies. In an embodiment of the invention, the wavelength conversion module may have the improved thermal conductivity, heat resistance and reliability through selecting the material of the first bonding material and the first filling adhesive material. Besides, the wavelength conversion module may ensure the good conversion efficiency of the wavelength conversion layer through the first filling adhesive material filling in the holes. In addition, the projection device using said the wavelength conversion module may also have good reliability and conversion efficiency. The method for forming the wavelength conversion module provided in one or more embodiments of the invention includes the additional process of filling the first filling adhesive material, and therefore enables the wavelength conversion module to have good reliability and conversion efficiency.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the drawings being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
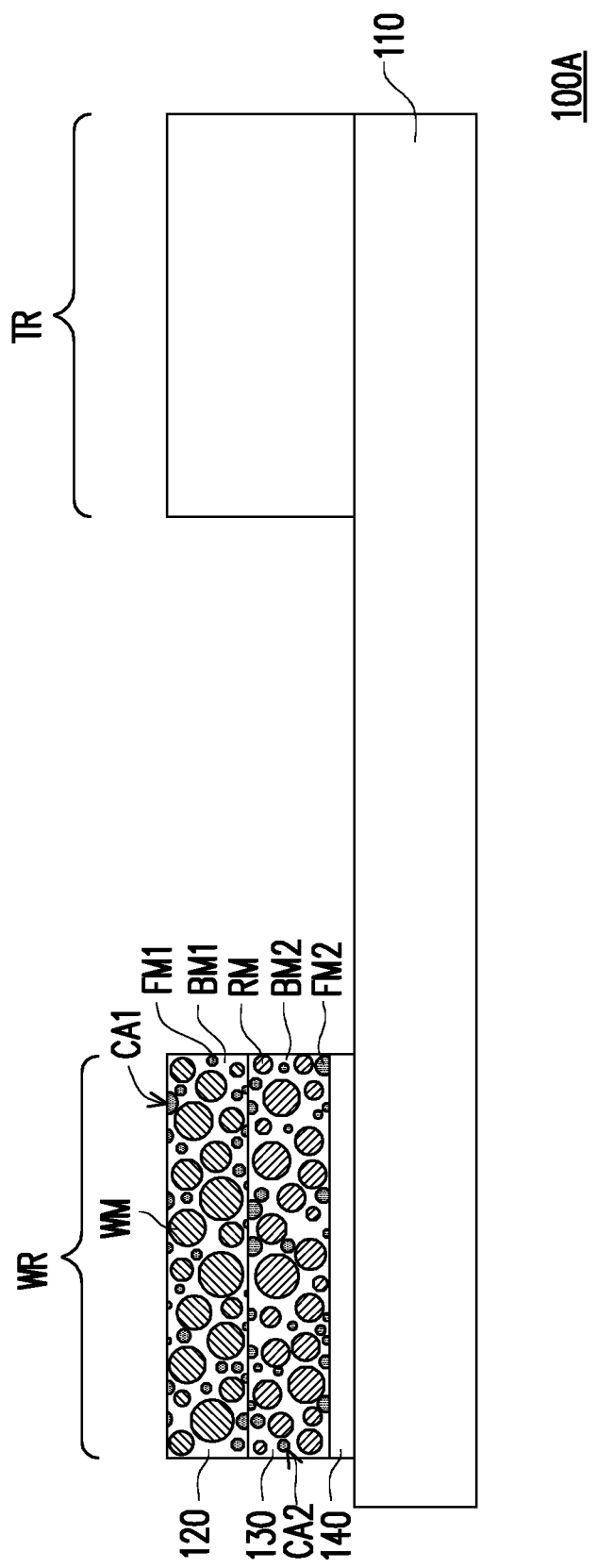
FIG. 1A is a schematic cross-sectional view of a wavelength conversion module according to an embodiment of the invention.
Figure 1B:
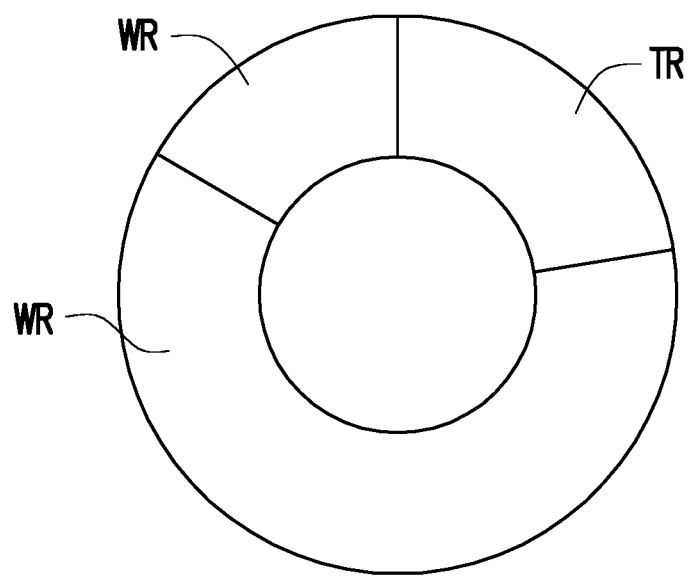
FIG. 1B is a top view of the wavelength conversion module depicted in FIG. 1A.

FIG. 1A is a schematic cross-sectional view of a wavelength conversion module according to an embodiment of the invention. FIG. 1B is a top view of the wavelength conversion module depicted in FIG. 1A. With reference to FIG. 1A and FIG. 1B, the wavelength conversion module 100A provided in the embodiment has at least one wavelength conversion region WR and a light pervious region TR, and the wavelength conversion module 100A includes a substrate 110 and a wavelength conversion layer 120. In particular, as shown in FIG. 1A, the wavelength conversion layer 120 provided in the embodiment is located on the substrate 110 and disposed corresponding to the wavelength conversion region WR. In the embodiment, a material of the substrate 110 may be a material having good thermal conductivity and heat resistance, such as aluminum, aluminum nitride, and so on.

More specifically, as shown in FIG. 1A, in the present embodiment, the wavelength conversion layer 120 has a plurality of first holes CA1 and includes a wavelength conversion material WM, a first bonding material BM1, and a first filling adhesive material FM1. The wavelength conversion material WM is dispersed in the first bonding material BM1. The first filling adhesive material FM1 is used to fill at least one portion of the first holes CA1.

For example, in the embodiment, the wavelength conversion material WM is, for example, phosphor powder, the first bonding material BM1 is an inorganic bonding material made of silica, silicate, phosphate, nano-scale silica, or the like, and the first bonding material BM1 has good thermal conductivity. As such, the resultant wavelength conversion layer 120 may have good thermal conductivity, heat resistance, and reliability, and thus the wavelength conversion layer 120 can withstand significant amount of laser energy.

In particular, in the process of forming the wavelength conversion layer 120 with use of the first bonding material BM1, the first holes CA1 are also formed in the wavelength conversion layer 120 and are thus located in the wavelength conversion layer 120. Hence, the first holes CA1 should be filled with the first filling adhesive material FM1. In particular, as shown in FIG. 1A, in the embodiment, the first filling adhesive material FM1 is located in the wavelength conversion layer 120 and fills a portion of these first holes CA1, so as to reduce the volume percentage of the first holes CA1 in the wavelength conversion layer 120. For instance, in the embodiment, the volume percentage of the first holes not filled by the first filling adhesive material FM1 may be reduced to at most 3% of the wavelength conversion layer 120. Note that the numerical ranges provided herein are for illustrative purposes only and should not be construed as limitations to the invention.

For instance, according to the present embodiment, the first filling adhesive material FM1 is an inorganic bonding material. Thereby, while reducing the proportion of the volume of the first holes CA1 in the wavelength conversion layer 120, the wavelength conversion layer 120 can still retain its good thermal conductivity and heat resistance and can withstand significant amount of laser energy. Besides, in the embodiment, the first filling adhesive material FM1 and the first bonding material BM1 may be determined according to manufacturing or product requirements. For example, in the embodiment, the first filling adhesive material FM1 and the first bonding material BM1 may be determined to be the same material or different materials according to the compatibility of the manufacturing process and/or the components, so as to minimize the proportion of the volume of the first holes CA1 in the wavelength conversion layer 120. As such, the resultant structure is dense, thus increasing the reliability of the wavelength conversion module.

On the other hand, as shown in FIG. 1A, in the embodiment, the wavelength conversion module 100A further includes a reflective layer 130 located between the substrate 110 and the wavelength conversion layer 120. In particular, as shown in FIG. 1A, the reflective layer 130 has a plurality of second holes CA2 and includes a scattering material RM, a second bonding material BM2, and a second filling adhesive material FM2. The scattering material RM is evenly dispersed in the second bonding material BM2, and the second filling adhesive material FM2 is configured to fill at least one portion of the second holes CA2.

For example, in the embodiment, the second bonding material BM2 is also an inorganic bonding material made of silica, silicate, phosphate, nano-scale silica, or the like, and the second bonding material BM2 has good thermal conductivity. In addition, the scattering material RM may be titanium dioxide ($TiO_2$), silicon dioxide ($SiO_2$), aluminum oxide ($Al_2O_3$), boron nitride (BN), zirconium dioxide ($ZrO_2$), and so on. Thereby, the resultant reflective layer 130 may have good thermal conductivity, heat resistance, and reliability, and thus the reflective layer 130 can withstand significant amount of laser energy.

However, in the process of forming the reflective layer 130 by mixing the scattering material RM with the second bonding material BM2, the second holes CA2 are also formed and thus should be filled with the second filling adhesive material FM2. In particular, as shown in FIG. 1A, according to the embodiment, the second filling adhesive material FM2 fills a portion of the second holes CA2, so as to reduce the volume percentage of the second holes CA2 in the reflective layer 130. For instance, in the embodiment, the volume percentage of the second holes not filled by the second filling adhesive material FM2 may be reduced to at most 3% of the reflective layer 130. Note that the numerical ranges provided herein are for illustrative purposes only and should not be construed as limitations to the invention.

For example, in the embodiment, the second filling adhesive material FM2 is an inorganic bonding material. Thereby, while reducing the proportion of the volume of the second holes CA2 in the reflective layer 130, the reflective layer 130 can still retain its good thermal conductivity and heat resistance and can withstand significant amount of laser energy. Besides, in the embodiment, the second filling adhesive material FM2 and the second bonding material BM2 may be selected according to manufacturing or product requirements. For example, in the embodiment, the second filling adhesive material FM2 and the second bonding material BM2 may be determined to be the same material or different materials according to the compatibility of the manufacturing process and/or the components, so as to minimize the proportion of the volume of the second holes CA2 in the reflective layer 130. As such, the resultant structure is dense, thus increasing the reliability of the wavelength conversion module.

In addition, as shown in FIG. 1A, in the embodiment, the wavelength conversion module 100A may also optionally include a thermal conductive adhesive layer 140 located between the reflective layer 130 and the substrate 110. When the curing temperature at which the reflective layer 130 is being formed is greater than 300° C., the reflective layer 130 may be formed first, and the reflective layer 130 is attached to the substrate 110 by the thermal conductive adhesive layer 140. Besides, the thermal conductive adhesive layer 140 provided in the embodiment is exemplified to be located between the reflective layer 130 and the substrate 110; however, the invention is not limited thereto. In other embodiments, if the curing temperature at which the wavelength conversion layer 120 is being formed is also greater than 300° C., it is also possible to first form the wavelength conversion layer 120, and the wavelength conversion layer 120 is attached to the reflective layer 130 by another thermal conductive adhesive layer (not shown). The thermal conductive layer is located between the wavelength conversion layer 120 and the reflective layer 130 and is made of a transparent material. For other details, reference may be made to the description of the embodiment depicted in FIG. 5B, and thus the details will not be further explained hereinafter.

In this way, the wavelength conversion module 100A may have the improved thermal conductivity, heat resistance, and reliability through selecting the materials of the first bonding material BM1, the second bonding material BM2, the first filling adhesive material FM1, and the second filling adhesive material FM2. Besides, the wavelength conversion module 100A can also ensure the good conversion efficiency of the wavelength conversion layer 120 through the first filling adhesive material FM1 filling the first holes CA1.

Figure 2:
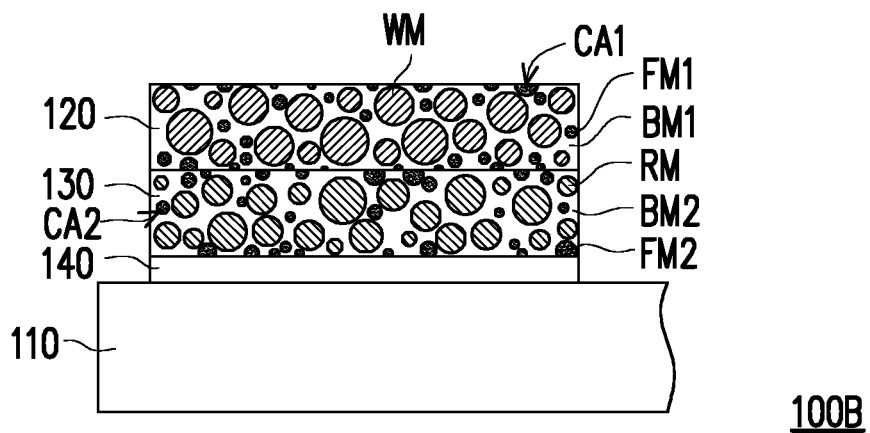
FIG. 2 to FIG. 12 are schematic cross-sectional views showing a wavelength conversion module according to various embodiments of the invention.

FIG. 2 is a schematic cross-sectional view showing a wavelength conversion module according to an embodiment of the invention. With reference to FIG. 2, the wavelength conversion module 100B depicted in FIG. 2 is similar to the wavelength conversion module 100A depicted in FIG. 1A, and the differences are described below. In the embodiment, the first filling adhesive material FM1 of the wavelength conversion module 100B is an organic bonding material, and the second filling adhesive material FM2 is also an organic bonding material. For instance, the first filling adhesive material FM1 and the second filling adhesive material FM2 may be made of silicone. Due to the significant amount of solid content of the organic bonding material, the organic bonding material can fill more holes after curing, thus reducing the volume ratio of the first holes CA1 in the wavelength conversion layer 120 and the second holes CA2 in the reflective layer 130 and forming a dense structure. As such, the structural strength and reliability of the wavelength conversion module may be enhanced, and the conversion efficiency of the wavelength conversion module may be optimized.

Besides, the wavelength conversion module 100B may have the improved thermal conductivity, heat resistance, and reliability through determining of the first bonding material BM1 and the second bonding material BM2 to be the inorganic bonding material, so as to achieve similar effects as those accomplished by the aforesaid wavelength conversion module, which will not be further elaborated hereinafter.

Figure 3:
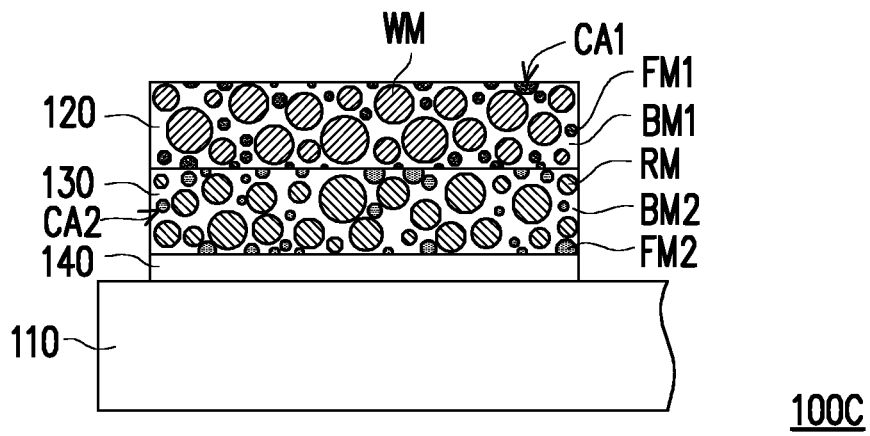

FIG. 3 is a schematic cross-sectional view showing a wavelength conversion module according to an embodiment of the invention. The wavelength conversion module 100C depicted in FIG. 3 is similar to the wavelength conversion module 100A depicted FIG. 1A, and the differences are described below. In the embodiment, the first filling adhesive material FM1 of the wavelength conversion module 100C is an organic bonding material, and the second filling adhesive material FM2 is an inorganic bonding material. Through determining the first filling adhesive material FM1 to be the organic bonding material, the volume ratio of the first holes CA1 in the wavelength conversion layer 120 may be reduced, and the resultant structure is dense. As such, the structural strength and reliability of the wavelength conversion module may be enhanced, and the conversion efficiency of the wavelength conversion module may be optimized.

Additionally, through the determination of the second filling adhesive material FM2 to be the inorganic bonding material, the volume ratio of the second holes CA2 in the reflective layer 130 may be reduced without sacrificing thermal conductivity and heat resistance, and the wavelength conversion module can withstand significant amount of laser energy. Besides, in the embodiment, the second filling adhesive material FM2 and the second bonding material BM2 may be determined according to manufacturing or product requirements, so as to minimize the proportion of the volume of the second holes CA2 in the reflective layer 130 and optimize the reliability of the wavelength conversion module.

The wavelength conversion module 100C may have the improved thermal conductivity, heat resistance, and reliability through determining the materials of the first bonding material BM1 and the second bonding material BM2 to be the inorganic bonding material, so as to achieve similar effects as those accomplished by the aforesaid wavelength conversion module, which will not be further elaborated hereinafter.

Figure 4:
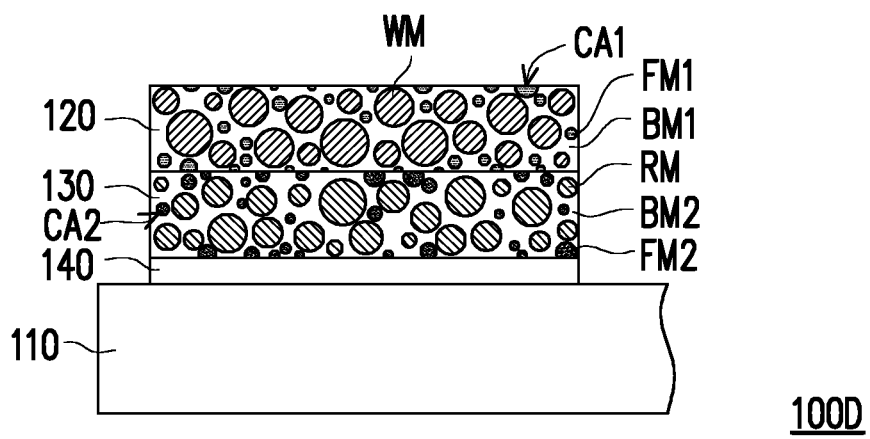

FIG. 4 is a schematic cross-sectional view showing a wavelength conversion module according to an embodiment of the invention. The wavelength conversion module 100D depicted in FIG. 4 is similar to the wavelength conversion module 100A depicted in FIG. 1A, and the differences are described below. In the embodiment, the first filling adhesive material FM1 of the wavelength conversion module 100D is an inorganic bonding material, and the second filling adhesive material FM2 is an organic bonding material. Thereby, while reducing the proportion of the volume of the first holes CA1 in the wavelength conversion layer 120, since the first filling adhesive material FM1 is an inorganic bonding material having good thermal conductivity and heat resistance, good thermal conductivity and heat resistance can still be ensured, and thereby able to withstand significant amount of laser energy. Besides, in the embodiment, the first filling adhesive material FM1 and the first bonding material BM1 may be determined according to manufacturing or product requirements, so as to minimize the proportion of the volume of the first holes CA1 in the wavelength conversion layer 120 and form the dense structure, thus increasing the reliability of the wavelength conversion module.

In addition, through the determination of the second filling adhesive material FM2 to be the organic bonding material, the proportion of the volume of the second holes CA2 in the reflective layer 130 may be reduced, and the resultant structure is dense. As such, the structural strength and reliability of the wavelength conversion module may be enhanced, and the conversion efficiency of the wavelength conversion module may be optimized.

Moreover, the wavelength conversion module 100D may have the improved thermal conductivity, heat resistance, and reliability through determining the materials of the first bonding material BM1 and the second bonding material BM2 to be the inorganic bonding material, so as to achieve similar effects as those accomplished by the aforesaid wavelength conversion module, which will not be further elaborated hereinafter.

Figure 5A:
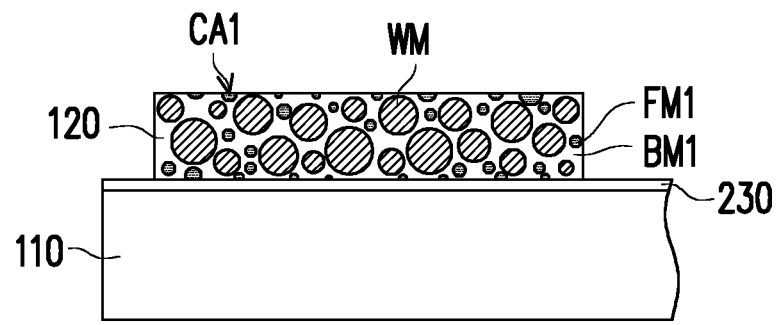

FIG. 5A is a schematic cross-sectional view showing a wavelength conversion module according to an embodiment of the invention. The wavelength conversion module 200A depicted in FIG. 5A is similar to the wavelength conversion module 100A depicted in FIG. 1A, and the differences are described below. In the embodiment, the reflective layer 230 is a metal layer on the surface of the substrate 110. The reflective layer 230 has a coated protective layer or a coated dielectric layer thereon, and the metal layer may be made of silver or aluminum. Since the thickness of the reflective layer 230 is extremely thin, the reflective layer 230 has good thermal conductivity and heat resistance and can withstand significant amount of laser energy, so as to improve thermal conductivity, heat resistance and reliability of the wavelength conversion module. Accordingly, the reflective layer 230 of the wavelength conversion module 200A need not be equipped with any scattering material, filling adhesive material, or the like.

Besides, the wavelength conversion module 200A may have the improved thermal conductivity, heat resistance, and reliability through determining the materials of the first filling adhesive material FM1 and the first bonding material BM1 of the wavelength conversion layer 120 to be the inorganic bonding material, so as to achieve similar effects as those accomplished by the aforesaid wavelength conversion module, which will not be further elaborated hereinafter.

Figure 5B:
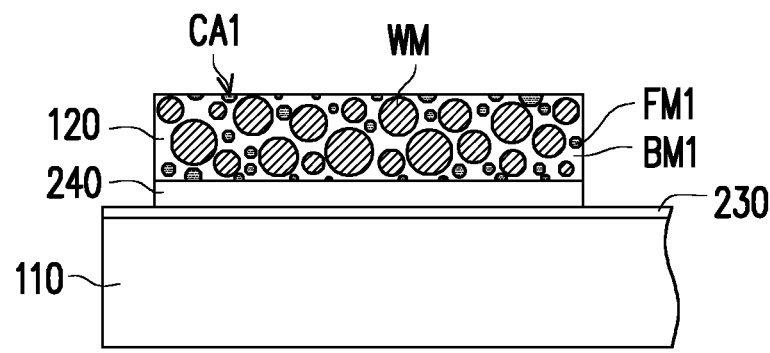

FIG. 5B is a schematic cross-sectional view showing a wavelength conversion module according to an embodiment of the invention. The wavelength conversion module 200B depicted in FIG. 5B is similar to the wavelength conversion module 200A depicted in FIG. 5A, and the differences are described below. In the embodiment, the wavelength conversion module 200B includes a thermal conductive adhesive layer 240 located between the reflective layer 230 and the wavelength conversion layer 120. For instance, in the embodiment, when the curing temperature at which the wavelength conversion layer 120 is being formed is also greater than 300° C., the wavelength conversion layer 120 may be formed first, and the wavelength conversion layer 120 is attached to the reflective layer 230 by the thermal conductive adhesive layer 240. Thereby, the thermal conductive adhesive layer 240 is located between the wavelength conversion layer 120 and the reflective layer 230, and the thermal conductive adhesive layer 240 may be selectively made of a transparent material, which allows the converted light beam generated in the wavelength conversion layer 120 to penetrate the thermal conductive adhesive layer 240. After the converted light beam is reflected by the reflective layer 230, the light beam is emitted from the light exit surface of the wavelength conversion layer 120.

In the embodiment, the wavelength conversion module 200B may have the improved thermal conductivity, heat resistance, and reliability through determining the first filling adhesive material FM1 and the first bonding material BM1 to be the inorganic bonding material, so as to achieve similar effects as those accomplished by the aforesaid wavelength conversion module, which will not be further elaborated hereinafter.

Figure 6:
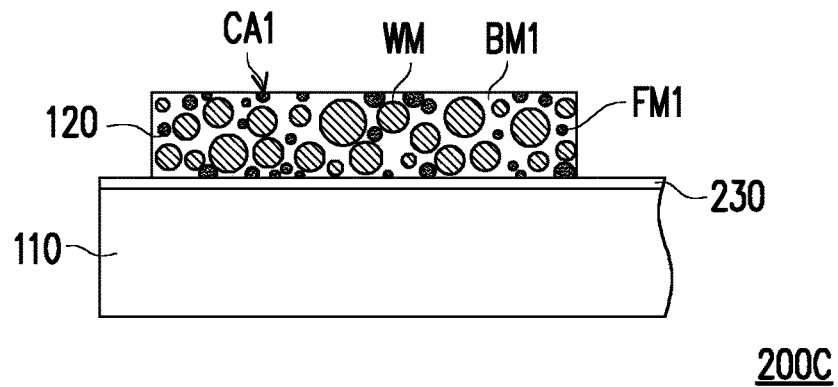

FIG. 6 is a schematic cross-sectional view showing a wavelength conversion module according to an embodiment of the invention. The wavelength conversion module 200C depicted in FIG. 6 is similar to the wavelength conversion module 200A depicted in FIG. 5A, and the differences are described below. In the embodiment, the first filling adhesive material FM1 of the wavelength conversion module 200C is an organic bonding material. Through the determination of the first filling adhesive material FM1 to be the organic bonding material, the volume ratio of the first holes CA1 in the wavelength conversion layer 120 may be reduced, and the resultant structure is dense. As such, the structural strength and reliability of the wavelength conversion module may be enhanced, and the conversion efficiency of the wavelength conversion module may be optimized.

The wavelength conversion module 200C may have the improved thermal conductivity, heat resistance, and reliability through determining the material of the first bonding material BM1 to be the inorganic bonding material, so as to achieve similar effects as those accomplished by the aforesaid wavelength conversion module, which will not be further elaborated hereinafter.

Figure 7:
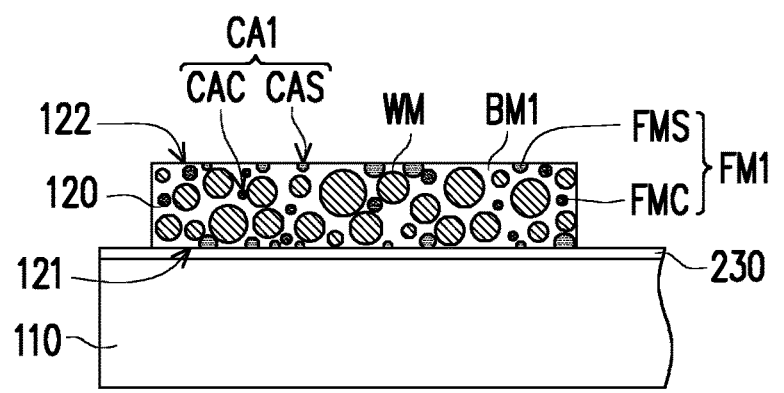
Figure 8:
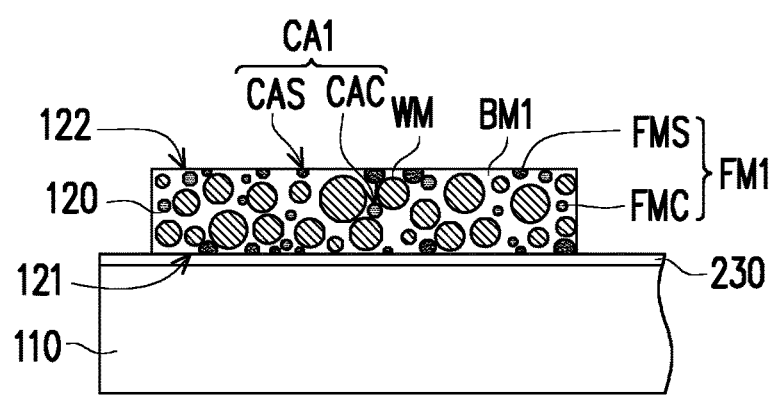

FIG. 7 and FIG. 8 are schematic cross-sectional views showing a wavelength conversion module according to an embodiment of the invention. The wavelength conversion module 200D depicted in FIG. 7 and the wavelength conversion module 200E depicted in FIG. 8 are similar to the wavelength conversion module 200A depicted in FIG. 5, and the differences are described below. In the embodiments, at least one portion of the first filling adhesive material FM1 of the wavelength conversion module 200D and the wavelength conversion module 200E is different from the first bonding material BM1.

In particular, as shown in FIG. 7 and FIG. 8, the wavelength conversion layer 120 has a first surface 121 and a second surface 122 opposite to each other, and the first surface 121 faces the substrate 110. The first holes CA1 in the wavelength conversion layer 120 include a plurality of surface holes CAS and a plurality of center holes CAC. The surface holes CAS are adjacent to the first surface 121 and the second surface 122, and the center holes CAC are not adjacent to the first surface 121 and the second surface 122 as compared to the surface holes CAS. That is, the central holes CAC are interspersed between the surface holes CAS adjacent to the first surface 121 in the wavelength conversion layer 120 and the surface holes CAS adjacent to the second surface 122. Besides, as shown in FIG. 7 and FIG. 8, the first filling adhesive material FM1 includes a surface filling adhesive material FMS for filling the surface holes CAS and a center filling adhesive material FMC for filling the center holes CAC.

In these embodiments, the surface filling adhesive material FMS and the center filling adhesive material FMC may be selectively different from each other. In particular, the surface filling adhesive material FMS is one of an inorganic bonding material and an organic bonding material, and the center filling adhesive material FMC is the other of the inorganic bonding material and the organic bonding material. For instance, in the embodiment depicted in FIG. 7, the surface filling adhesive material FMS is the inorganic bonding material, and the center filling adhesive material FMC is the organic bonding material; in the embodiment depicted in FIG. 8, the surface filling adhesive material FMS is the organic bonding material, and the center filling adhesive material FMC is the inorganic bonding material.

The first filling adhesive material FM1 located at different positions in the wavelength conversion layer 120 may be determined in response to the manufacturing or product requirements. For instance, in the process of filling with the first filling adhesive material FM1, a number of factors required to be considered include diameters of particles, properties of contact surfaces, molecular hydrophilicity, and so on. Hence, the surface filling adhesive material FMS and the center filling adhesive material FMC may be determined to be the most effective material for penetrating or filling the first holes CA1 in consideration of the compatibility of the manufacturing process and/or the components. Here, the surface filling adhesive material FMS and the center filling adhesive material FMC may be determined to be inorganic bonding materials or organic bonding materials, so as to minimize the proportion of the volume of the first holes CA1 in the wavelength conversion layer 120 and form a dense structure. As such, the reliability and the conversion efficiency of the wavelength conversion module may be optimized.

Besides, the wavelength conversion module 200D and the wavelength conversion module 200E may have the improved thermal conductivity, heat resistance, and reliability through determining the material of the first bonding material BM1 to be the inorganic bonding material, so as to achieve similar effects as those accomplished by the aforesaid wavelength conversion module, which will not be further elaborated hereinafter.

Figure 9:
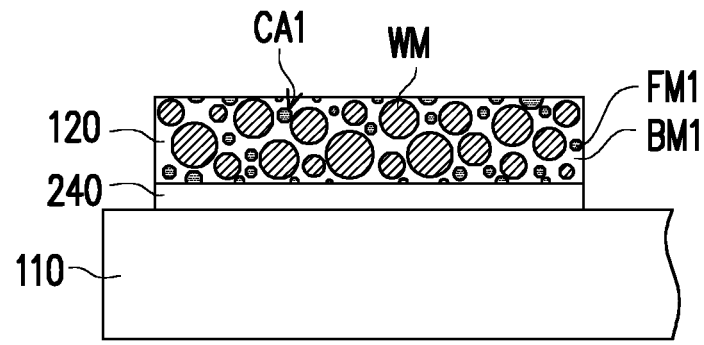

FIG. 9 is a schematic cross-sectional view showing a wavelength conversion module according to an embodiment of the invention. The wavelength conversion module 300A depicted in FIG. 9 is similar to the wavelength conversion module 100A depicted in FIG. 1A or the wavelength conversion module 200B depicted in FIG. 5B, and the differences are described below. In the embodiment, the wavelength conversion module 300A does not include the reflective layer 130 or the reflective layer 230, and the substrate 110 is made of a transparent material. For instance, the material of the substrate 110 may be glass. In addition, the thermal conductive adhesive layer 240 may be selectively formed in the wavelength conversion module 300A according to actual requirements, and the thermal conductive adhesive layer 240 is located between the substrate 110 and the wavelength conversion layer 120. For other details of the thermal conductive adhesive layer 240, reference may be made to the description of the embodiment depicted in FIG. 5B, and thus the details will not be further explained hereinafter.

As such, the wavelength conversion module 300A may become a transmissive wavelength conversion module, so that the converted light beam generated in the wavelength conversion layer 120 may sequentially pass through the thermal conductive adhesive layer 240 and the substrate 110. Besides, the wavelength conversion module 300A may have the improved thermal conductivity, heat resistance, and reliability through determining the materials of the first filling adhesive material FM1 and the first bonding material BM1 to be the inorganic bonding materials, so as to achieve similar effects as those accomplished by the aforesaid wavelength conversion module, which will not be further elaborated hereinafter.

Figure 10:
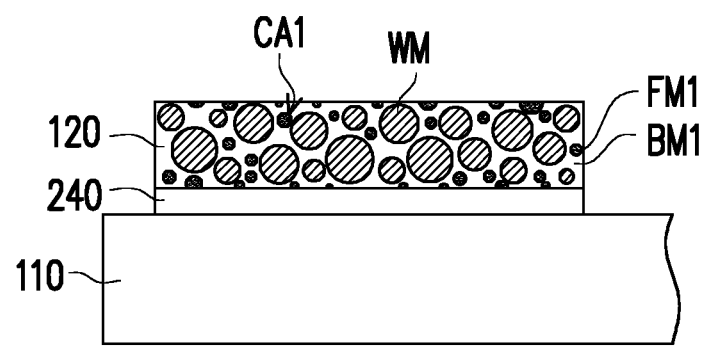
Figure 11:
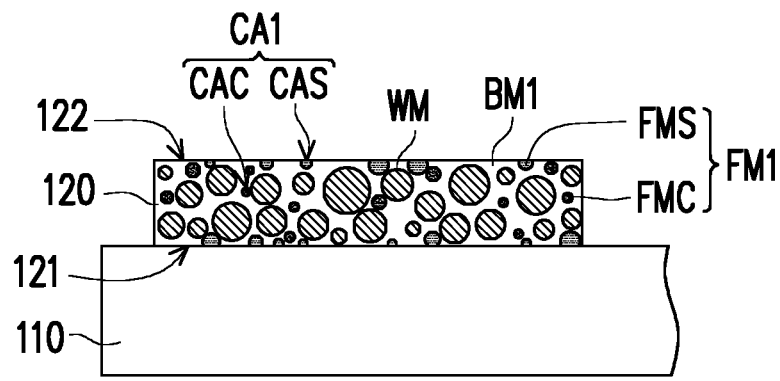
Figure 12:
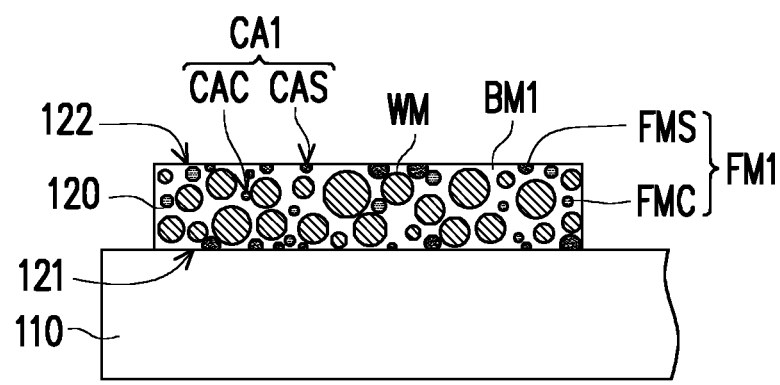

FIG. 10 to FIG. 12 are schematic cross-sectional views showing a wavelength conversion module according to various embodiments of the invention. The wavelength conversion module 300B, the wavelength conversion module 300C, and the wavelength conversion module 300D depicted in FIG. 10 to FIG. 12 are similar to the wavelength conversion module 100B depicted in FIG. 2, the wavelength conversion module 200D depicted in FIG. 7, and the wavelength conversion module 200E depicted in FIG. 8, respectively, and the differences are described below. In the embodiment, the wavelength conversion module 300B, the wavelength conversion module 300C, and the wavelength conversion module 300D do not include the reflective layer 130 or the reflective layer 230, and the substrate 110 is made of a transparent material. In addition, the thermal conductive adhesive layer 240 may be selectively formed in the wavelength conversion module 300B, the wavelength conversion module 300C, and the wavelength conversion module 300D according to actual requirements, and the thermal conductive adhesive layer 240 is located between the substrate 110 and the wavelength conversion layer 120. For other details of the thermal conductive adhesive layer 240, reference may be made to the description of the embodiment depicted in FIG. 5B, and thus the details will not be further explained hereinafter.

As such, the wavelength conversion module 300B, the wavelength conversion module 300C, and the wavelength conversion module 300D may become transmissive wavelength conversion modules. Besides, the wavelength conversion module 300B, the wavelength conversion module 300C, and the wavelength conversion module 300D may have the improved thermal conductivity, heat resistance, and reliability through proper determination of the first filling adhesive material FM1 and the first bonding material BM1, so as to achieve similar effects as those accomplished by the wavelength conversion module 100B, the wavelength conversion module 200D, and the wavelength conversion module 200E, which will not be further elaborated hereinafter The manufacturing processes of the wavelength conversion module 100A to the wavelength conversion module 200E will be further explained below with reference to FIG. 13A to FIG. 14B.

Figure 13A:
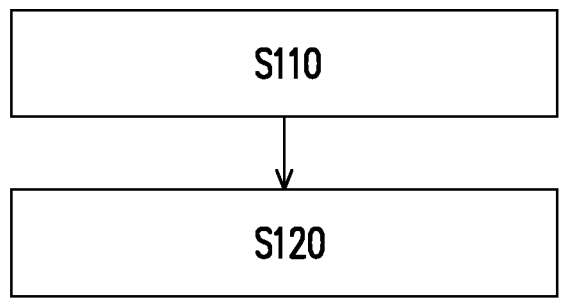
FIG. 13A is a flow chart of manufacturing a wavelength conversion module according to an embodiment of the invention.
Figure 13B:
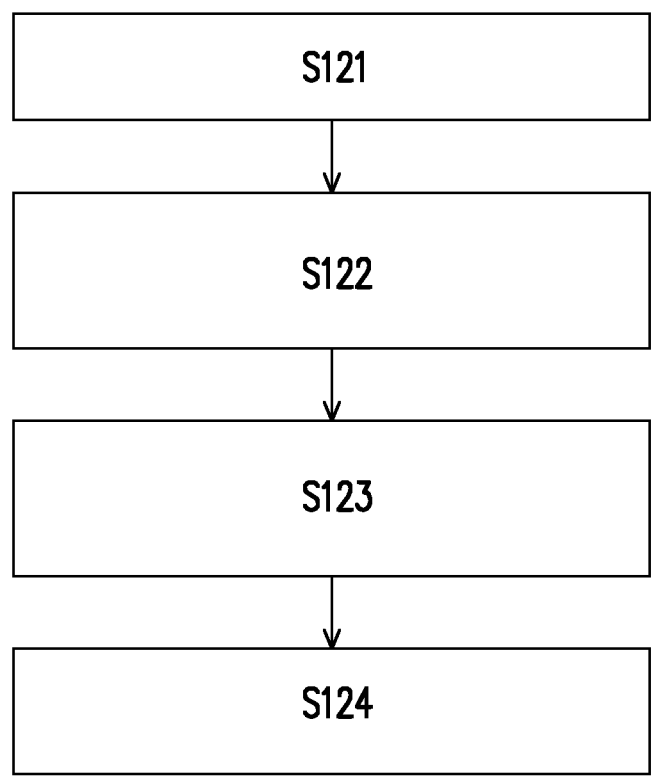
FIG. 13B is a flow chart of a wavelength conversion layer manufacturing process depicted in FIG. 13A.

FIG. 13A is a flow chart of manufacturing a wavelength conversion module according to an embodiment of the invention. FIG. 13B is a flow chart of a wavelength conversion layer manufacturing process depicted in FIG. 13A. With reference to FIG. 13A, first, step S110 is performed to provide a substrate 110. Step S120 is then performed to form a wavelength conversion layer 120 on the substrate 110, and the wavelength conversion layer 120 is formed by performing a wavelength conversion layer manufacturing process.

For instance, as shown in FIG. 13B, the wavelength conversion layer manufacturing process may include following steps S121, S122, S123, and S124. First, step S121 is performed to provide a wavelength conversion material WM and a first bonding material BM1, wherein the wavelength conversion material WM is dispersed in the first bonding material BM1. Step S122 is then performed to cure the wavelength conversion material WM and the first bonding material BM1 at a first curing temperature and form a plurality of first holes CA dispersed in the first bonding material BM1. Step S123 is performed to provide a first filling adhesive material FM1 and fill at least part of the first holes CA1 with the first filling adhesive material FM1. A method of filling the first holes CA1 with the first filling adhesive material FM1 includes, for instance, immersion, high pressure injection, high pressure application, vacuum degassing, and so forth. Thereby, the first filling adhesive material FM1 may penetrate part of the first holes CAL Step S124 is then performed to cure the first filling adhesive material FM1 at a second curing temperature, so as to form the wavelength conversion layer 120.

When the first curing temperature in step S122 or the second curing temperature in step S124 is greater than 300° C., note that the wavelength conversion layer 120 may be formed by performing the wavelength conversion layer manufacturing process (i.e., performing steps S121 to S124), and the wavelength conversion layer 120 is attached to the substrate 110 by the thermal conductive adhesive layer 240, so as to form a structure similar to the wavelength conversion module 300A and the wavelength conversion module 300B depicted in FIG. 9 to FIG. 10.

On the other hand, when the first curing temperature in step S122 or the second curing temperature in step S124 is less than or equal to 300° C., the wavelength conversion layer manufacturing process may be selectively performed directly on the substrate 110, and a method of providing the wavelength conversion material WM and the first bonding material BM1 in step S121 includes coating the wavelength conversion material WM and the first bonding material BM1 onto the substrate 110. For instance, after a mixture of the wavelength conversion material WM and the first bonding material BM1 is formed, the mixture is coated onto the substrate 110, and steps S122 to S124 are continuously performed, so as to form a structure similar to the wavelength conversion module 300C and the wavelength conversion module 300D depicted in FIG. 11 to FIG. 12.

Figure 14A:
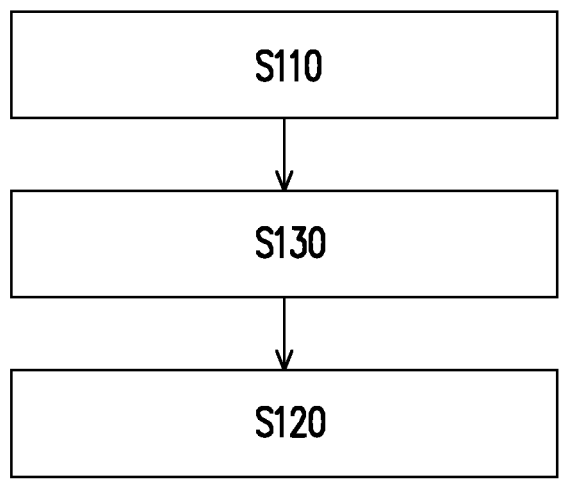
FIG. 14A is a flow chart of manufacturing another wavelength conversion module according to an embodiment of the invention.
Figure 14B:
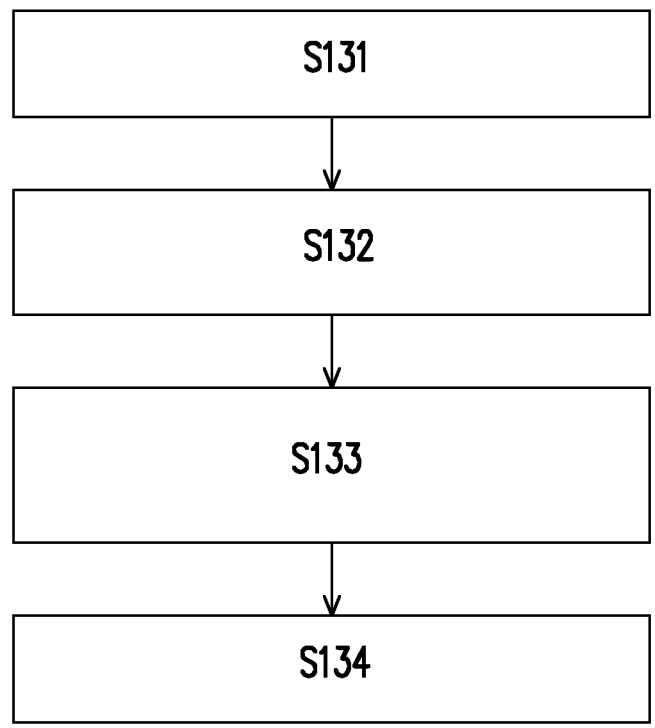
FIG. 14B is a flow chart of a reflective layer manufacturing process depicted in FIG. 14A.

FIG. 14A is a flow chart of manufacturing another wavelength conversion module according to an embodiment of the invention. FIG. 14B is a flow chart of a reflective layer manufacturing process depicted in FIG. 14A. The manufacturing process of the wavelength conversion module depicted in FIG. 14A is similar to the manufacturing process of the wavelength conversion module depicted in FIG. 13A, and the differences are described below. In the embodiment, before performing step S120 of forming the wavelength conversion layer 120, step S130 is performed to form a reflective layer 130 or a reflective layer 230 on the substrate 110, and the reflective layer 130 or the reflective layer 230 is located between the substrate 110 and the wavelength conversion layer 120.

For example, a method of forming the reflective layer 230 on the substrate 110 includes coating a reflective material onto the substrate 110 or forming a reflective coating film on the substrate 110, so as to form a structure similar to the wavelength conversion module 200A depicted in FIG. 5A to the wavelength conversion module 200E depicted in FIG. 8. Alternatively, as shown in FIG. 14B, a reflective layer manufacturing process may be performed to form the reflective layer 130 in the wavelength conversion module 100A depicted in FIG. 1A to the wavelength conversion module 100D depicted in FIG. 4.

For instance, as shown in FIG. 14B, the reflective layer manufacturing process may include following steps S131, S132, S133, and S134. First of all, step S131 is performed to provide a scattering material RM and a second bonding material BM2, wherein the scattering material RM is evenly dispersed in the second bonding material BM2. Step S132 is then performed to cure the scattering material RM and the second bonding material BM2 and form a plurality of second holes CA2 dispersed in the second bonding material BM2. Step S133 is performed to provide a second filling adhesive material FM2 and fill at least part of the second holes CA2 with the second filling adhesive material FM2. A method of filling the second holes CA2 with the second filling adhesive material FM2 includes immersion, high pressure injection, high pressure application, vacuum degassing, and so forth. Step S134 is then performed to cure the second filling adhesive material FM2, so as to form a reflective layer.

When the curing temperature in step S132 or step S134 is greater than 300° C., note that the reflective layer 130 may be formed by performing the reflective layer manufacturing process (i.e., performing steps S131 to S134), and the reflective layer 130 is attached to the substrate 110 by a thermal conductive adhesive layer 140, so as to form a structure similar to the wavelength conversion module 100A to the wavelength conversion module 100D depicted in FIG. 1A to FIG. 4.

On the other hand, when the curing temperature in step S132 or step S134 is less than or equal to 300° C., the reflective layer 130 may also be selectively formed directly on the substrate 110. A method of providing the scattering material RM and the second bonding material BM2 in step S131 may include coating a mixture of the wavelength conversion material WM and the first bonding material BM1 onto the substrate 110. After that, steps S132 to S134 are continuously performed. Thereby, a structure similar to the wavelength conversion module 100A to the wavelength conversion module 100D depicted in FIG. 1A to FIG. 4 may be formed, whereas the structure is not equipped with the thermal conductive adhesive layer 140. In addition, the process of forming the reflective layer 130 directly on the substrate 110 is relatively cost-effective, which is conducive to mass production and commercial competition.

As such, the wavelength conversion module 100A to the wavelength conversion module 300D depicted in FIG. 1A to FIG. 12 can be formed. In these embodiments, due to the additional process of filling the first filling adhesive material FM1, the resultant wavelength conversion modules 100A to 300D may have good reliability and conversion efficiency.

Figure 15:
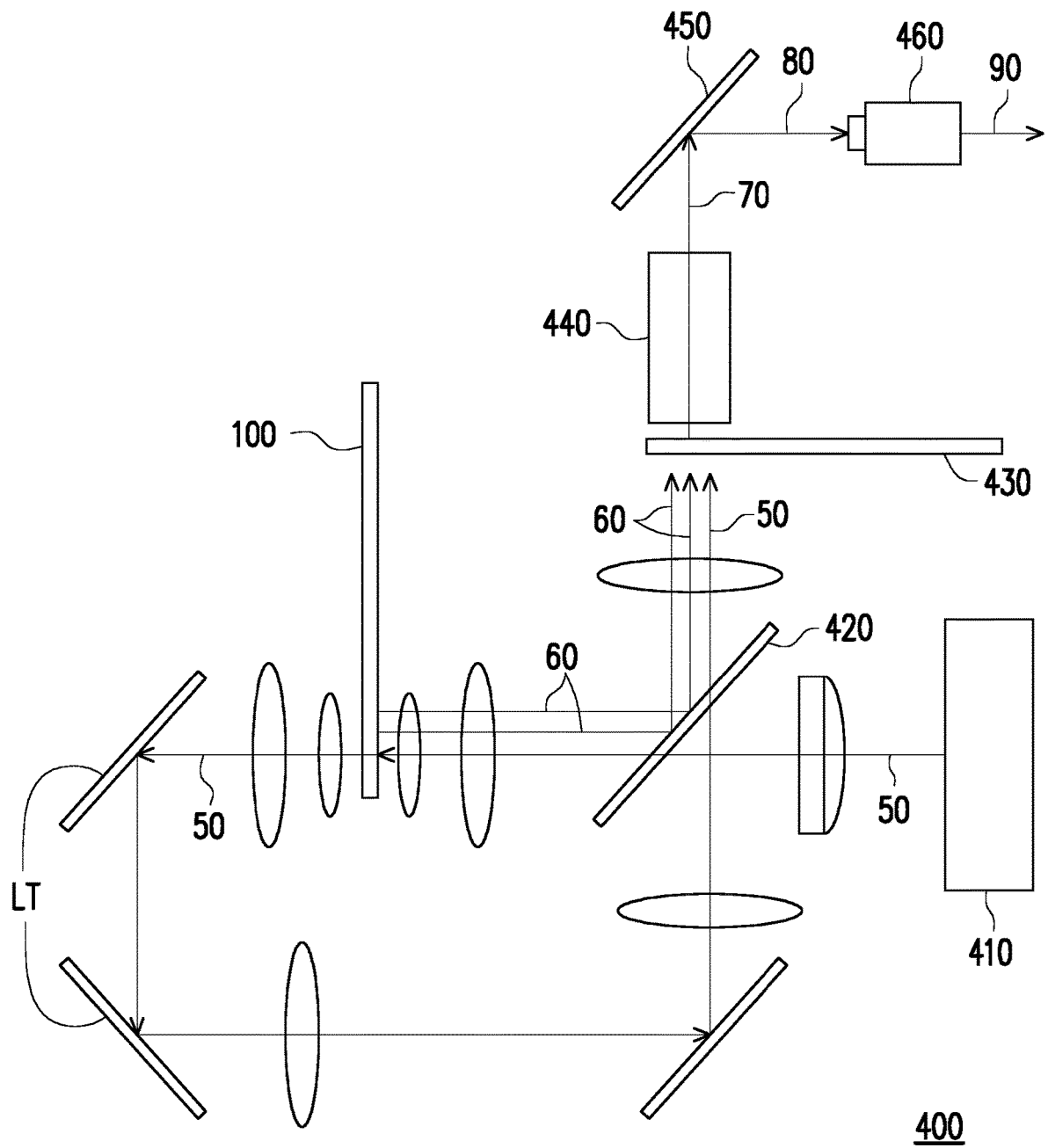
FIG. 15 is a schematic view of a structure of a projection device according to an embodiment of the invention.

FIG. 15 is a schematic view of a structure of a projection device according to an embodiment of the invention. With reference to FIG. 1A to FIG. 8 and FIG. 15 respectively, the projection device 400 includes an excitation light source 410, a beam splitting unit 420, the wavelength conversion module 100 (i.e., any of the wavelength conversion modules 100A, 100B, 100C, 100D, 200A, 200B, 200C, and 200D depicted in FIG. 1A-FIG. 8), a light valve 450, and a projection lens 460. In the present embodiment, the structures of the wavelength conversion modules 100A, 100B, 100C, 100D, 200A, 200B, 200C, 200D, and 200E have been described above in detail and thus will not be further explained hereinafter. In the embodiment, the light valve 450 is, for instance, a digital micro-mirror device (DMD) or a liquid-crystal-on-silicon panel (LPOS panel). However, in other embodiments, the light valve 450 may also be a transmissive liquid crystal panel or another beam modulator.

As shown in FIG. 15, in the embodiment, the excitation light source 410 is configured to emit an excitation beam 50. The excitation light source 410 provided in the embodiment is a laser light source, and the excitation beam 50 is a blue excitation beam. For example, the excitation light source 410 may include a plurality of blue laser diodes (not shown) arranged in an array, which should however not be construed as a limitation to the invention.

In particular, as shown in FIG. 15, in the embodiment, the beam splitting unit 420 is disposed on a transmission path of the excitation light beam 50 and located between the excitation light source 410 and the wavelength conversion module 100. In particular, the beam splitting unit 420 may be a partially transmissive, partially reflective element, a dichroic element, a polarization beam splitting element, or any other element that can separate the light beam. For instance, in the embodiment, the beam splitting unit 420 may, for example, allow a blue light beam to pass through but reflect light beams of other colors (such as red, green, yellow, and so forth). That is, the beam splitting unit 420 allows the blue excitation beam 50 to pass through, so that the excitation beam 50 penetrating the beam splitting unit 420 can then be incident to the wavelength conversion module 100.

For instance, as shown in FIG. 1A, FIG. 1B, and FIG. 15, the wavelength conversion module 100 is located on the transmission path of the excitation beam 50, and at least one wavelength conversion region WR of the wavelength conversion module 100 is configured to convert the excitation beam 50 into at least one converted beam 60. A light pervious region TR of the wavelength conversion module 100 is adapted to allow the excitation beam 50 to pass through and to be subsequently transmitted to a light transmission module LT and then back to the beam splitting unit 420. In addition, the wavelength conversion module 100 further includes a first actuator (not shown) configured to cause the light pervious region TR and the at least one wavelength conversion region WR to enter the illumination range of the excitation beam 50 at different times, which selectively causes the excitation beam 50 to pass through or to be converted into at least one converted beam 60. After that, as shown in FIG. 15, the excitation beam 50 coming from the wavelength conversion module 100 and the at least one converted beam 60 may be directed to the beam splitting unit 420 and subsequently reflected to a filter module 430.

For example, as shown in FIG. 15, the projection device 400 further includes the filter module 430 located on the transmission path of the excitation beam 50 and the converted beam 60, and the filter module 430 has at least one filter optical region (not shown) and a transparent region (not shown). The filter module 430 further includes a second actuator (not shown) configured to cause the filter optical region (not shown) to enter the illumination range of the converted beam 60 correspondingly at different times, so as to form a red beam and a green beam, respectively. On the other hand, the transparent region (not shown) of the filter module 430 is also allowed to enter the illumination range of the excitation beam 50 correspondingly at different times, so as to form a blue beam. Thereby, the excitation beam 50 and the converted beam 60 may form an illumination beam 70 with a plurality of different colors in a time sequence.

On the other hand, as shown in FIG. 15, in the embodiment, the projection device 400 also includes a light homogenizing element 440 located on the transmission path of the illumination beam 70. In the embodiment, the light homogenizing element 440 includes an integration rod, which should however not be construed as a limitation in the invention. To be more specific, as shown in FIG. 15, when the illumination beam 70 coming from the filter module 430 is transmitted to the light homogenizing element 440, the light homogenizing element 440 can homogenize the illumination beam 70 and transmit the same to the light valve 450.

After that, as shown in FIG. 15, the light valve 450 is located on the transmission path of the illumination beam 70 and configured to convert the illumination beam 70 into an image beam 80. The projection lens 460 is located on the transmission path of the image beam 80 and configured to convert the image beam 80 into a projection beam 90 which can be projected onto a screen (not shown) to form an image. After the illumination beam 70 is converged onto the light valve 450, the light valve 450 sequentially converts the illumination beam 70 into the image beam 80 of different colors and transmits the image beam 80 to the projection lens 460; therefore, the image frame formed by the projection beam 90 projected by the projection lens 460 may become a color image frame.

Since the projection device 400 is equipped with the wavelength conversion module 100 (i.e., any of the wavelength conversion modules 100A, 100B, 100C, 100D, 200A, 200B, 200C, 200D, and 200E depicted in FIG. 1A to FIG. 8) with good reliability and conversion efficiency, the projection device 400 may also be characterized by good reliability and conversion efficiency.

In the previous embodiments, the exemplary projection device 400 is equipped with any of the reflective wavelength conversion modules 100A, 100B, 100C, 100D, 200A, 200B, 200C, 200D, and 200E; however, the invention is not limited thereto. In other embodiments, the wavelength conversion module may also be a transmissive wavelength conversion module, and one having ordinary skill in the art will be able to make proper modifications to the light paths of the wavelength conversion module after referring to the disclosure, and these modifications should still fall within the scope of protection provided herein. Some embodiments are provided below for explanation.

Figure 16:
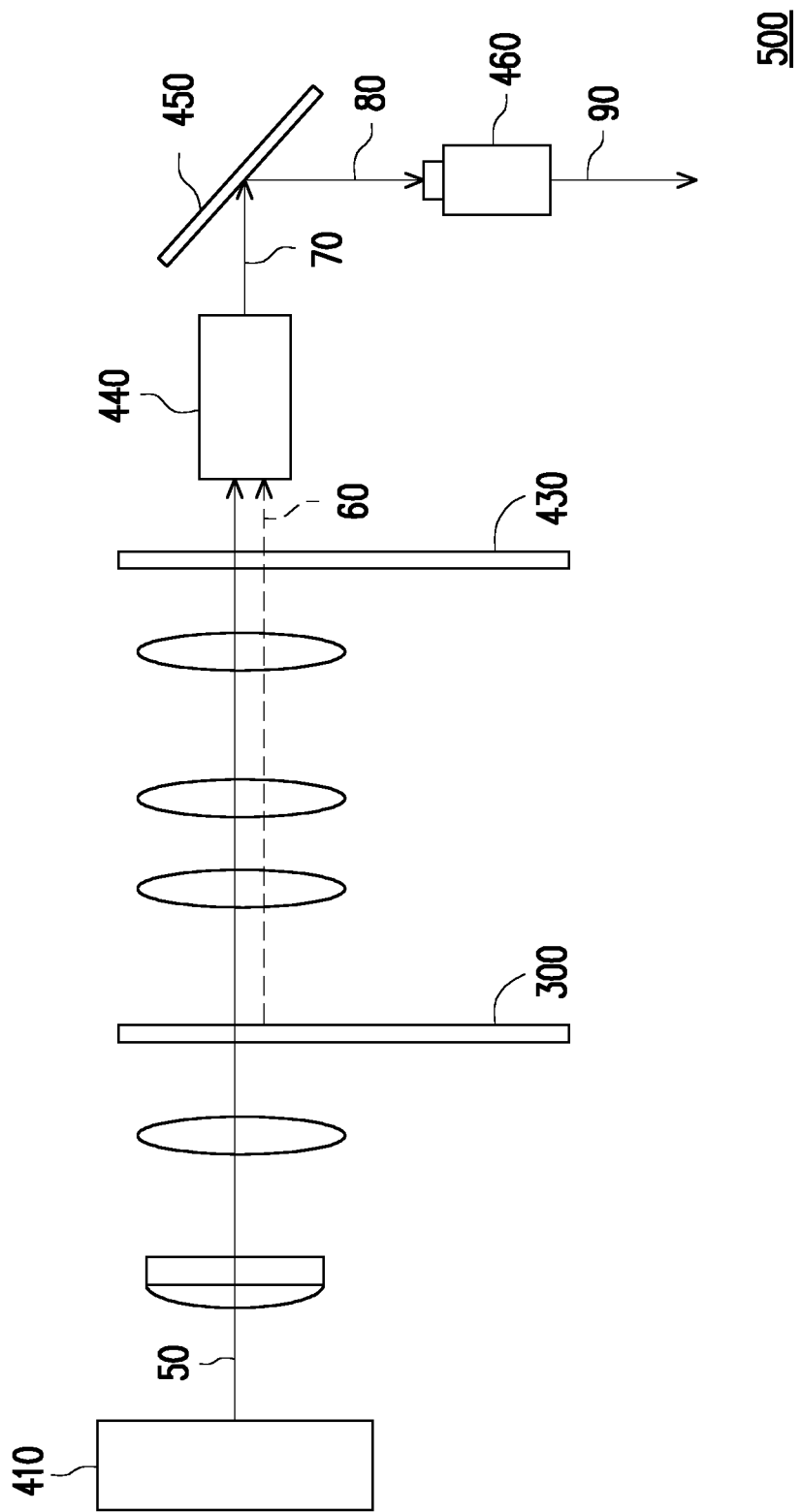
FIG. 16 is a schematic view of a structure of another projection device according to an embodiment of the invention.

FIG. 16 is a schematic view of a structure of another projection device according to an embodiment of the invention. With reference to FIG. 16, the projection device 500 provided in the present embodiment is similar to the projection device 400 depicted in FIG. 15, and the differences between the two are described below. In the embodiment, the projection device 500 is equipped with the wavelength conversion module 300 (i.e., any of the wavelength conversion modules 300A, 300B, 300C, and 300D depicted in FIG. 9 to FIG. 12) having no reflective layer, and the substrate is made of a transparent material. That is, the wavelength conversion module 300 is a transmissive wavelength conversion module and configured to allow the excitation beam 50 to pass through.

In particular, as shown in FIG. 16, in the embodiment, when the light pervious region TR of the wavelength conversion module 300 enters the illumination range of the excitation beam 50, the excitation beam 50 pass through the wavelength conversion module 300. On the other hand, in the embodiment, when at least one wavelength conversion region WR enters the illumination range of the excitation beam 50, the excitation beam 50 is converted into at least one converted beam 60 by the at least one wavelength conversion region WR, and the at least one converted beam 60 passes through the wavelength conversion module 300. After that, the excitation beam 50 and the at least one converted beam 60 coming from the wavelength conversion module 300 may be directed to the filter module 430. The filter module 430 further converts the excitation beam 50 and the at least one converted beam 60 into a red beam, a green beam and a blue beam, respectively, and thereby the illumination beam 70 and the image beam 80 are subsequently formed.

Since the projection device 500 is equipped with the wavelength conversion module 300 (i.e., any of the wavelength conversion modules 300A, 300B, 300C, and 300D depicted in FIG. 9 to FIG. 12) having good reliability and conversion efficiency, the projection device 500 may also have good reliability and conversion efficiency.

To sum up, embodiments of the invention have at least one of the following advantages or effects. In one or more embodiments of the invention, through the determination of the first bonding material and the first filling adhesive material, the wavelength conversion module may have the improved thermal conductivity, heat resistance, and reliability. Besides, the wavelength conversion module may ensure the good conversion efficiency of the wavelength conversion layer because of the first filling adhesive material filling the holes. In addition, the projection device equipped with the aforesaid wavelength conversion module may also have good reliability and conversion efficiency. The method for forming the wavelength conversion module provided in one or more embodiments of the invention includes an additional process of filling the first filling adhesive material, and therefore enables the wavelength conversion module to have good reliability and conversion efficiency.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A wavelength conversion module, comprising: a substrate and a wavelength conversion layer, the wavelength conversion layer being located on the substrate, having a plurality of first holes, and comprising: a wavelength conversion material, a first bonding material, and a first filling adhesive material, wherein the wavelength conversion material is dispersed in the first bonding material, the first filling adhesive material is an inorganic bonding material or an organic bonding material, and the first filling adhesive material is configured to fill at least one portion of the plurality of first holes dispersed in the first bond material.

2. The wavelength conversion module of claim 1, the other portion of the plurality of holes not filled by the first filling adhesive material accounts for 3% or less of a volume of the wavelength conversion layer.

3. The wavelength conversion module of claim 1, further comprising a reflective layer located between the substrate and the wavelength conversion layer.

4. The wavelength conversion module of claim 3, wherein the reflective layer has a plurality of second holes and comprises:
- a scattering material;
- a second bonding material, wherein the scattering material is evenly dispersed in the second bonding material; and
- a second filling adhesive material for filling at least one portion of the plurality of second holes.

5. The wavelength conversion module of claim 4, wherein the second filling adhesive material is an inorganic bonding material.

6. The wavelength conversion module of claim 4, wherein the second filling adhesive material is an organic bonding material.

7. The wavelength conversion module of claim 3, further comprising a thermal conductive adhesive layer located between the reflective layer and the substrate.

8. The wavelength conversion module of claim 1, wherein at least one portion of the first filling adhesive material is different from the first bonding material.

9. The wavelength conversion module of claim 8, the wavelength conversion layer having a first surface and a second surface opposite to each other, the plurality of first holes comprising a plurality of surface holes and a plurality of center holes, the plurality of surface holes being adjacent to the first surface and the second surface, the plurality of center holes being not adjacent to the first surface and the second surface as compared to the plurality of surface holes, the first filling adhesive material comprising a surface filling adhesive material for filling the plurality of surface holes and a center filling adhesive material for filling the plurality of center holes, the surface filling adhesive material being different from the center filling adhesive material.

10. The wavelength conversion module of claim 9, wherein the surface filling adhesive material is one of an inorganic bonding material and an organic bonding material, and the center filling adhesive material is the other of the inorganic bonding material and the organic bonding material.

11. The wavelength conversion module of claim 10, wherein the first bonding material is an inorganic bonding material.

12. The wavelength conversion module of claim 1, further comprising a thermal conductive adhesive layer located between the substrate and the wavelength conversion layer.

13. A projection device, comprising:
- the wavelength conversion module of claim 1;
- an excitation light source configured to emit an excitation beam, wherein the excitation beam is transmitted to the wavelength conversion module and converted into a converted beam by the wavelength conversion module, and the excitation beam and the converted beam form an illumination beam;
- a light valve located on a transmission path of the illumination beam and configured to convert the illumination beam into an image beam; and
- a projection lens located on the transmission path of the image beam and configured to convert the image beam into a projection beam.

14. A wavelength conversion module, comprising: a substrate and a wavelength conversion layer, the wavelength conversion layer being located on the substrate, having a plurality of first holes, and comprising: a wavelength conversion material, a first bonding material, and a first filling adhesive material, wherein
- the wavelength conversion material is dispersed in the first bonding material, and
- the first filling adhesive material is configured to fill at least one portion of the plurality of first holes;
- the wavelength conversion layer having a first surface and a second surface opposite to each other, the plurality of first holes comprising a plurality of surface holes and a plurality of center holes, the plurality of surface holes being adjacent to the first surface and the second surface, the plurality of center holes being not adjacent to the first surface and the second surface as compared to the plurality of surface holes, the first filling adhesive material comprising a surface filling adhesive material for filling the plurality of surface holes and a center filling adhesive material for filling the plurality of center holes, the surface filling adhesive material being different from the center filling adhesive material.

* * * * *